United States Patent
Nakata et al.

(10) Patent No.: US 6,780,498 B2
(45) Date of Patent: *Aug. 24, 2004

(54) SILICON-BASED COMPOSITION, LOW DIELECTRIC CONSTANT FILM, SEMICONDUCTOR DEVICE, AND METHOD FOR PRODUCING LOW DIELECTRIC CONSTANT FILM

(75) Inventors: Yoshihiro Nakata, Kawasaki (JP); Katsumi Suzuki, Kawasaki (JP); Iwao Sugiura, Kawasaki (JP); Ei Yano, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 11 days.

This patent is subject to a terminal disclaimer.

(21) Appl. No.: 09/983,951

(22) Filed: Oct. 26, 2001

(65) Prior Publication Data

US 2003/0003288 A1 Jan. 2, 2003

(30) Foreign Application Priority Data

Mar. 23, 2001 (JP) .................................... 2001-084475

(51) Int. Cl.$^7$ ............................. B32B 3/26; C08L 83/04
(52) U.S. Cl. ................. 428/312.6; 428/315.5; 428/315.7; 428/901; 524/588; 525/474; 525/477; 528/31; 528/35; 556/431; 438/781
(58) Field of Search ........................ 428/304.4, 308.4, 428/315.5, 312.2, 312.6, 315.7, 901; 438/624, 688, 424, 222, 781; 524/588; 525/474, 477; 528/31, 35; 556/431

(56) References Cited

U.S. PATENT DOCUMENTS 6,171,687 B1 * 1/2001 Leung et al. ............ 428/304.4
6,225,238 B1 * 5/2001 Wu ........................... 438/778
6,309,958 B1 * 10/2001 Okada ....................... 438/624
6,318,124 B1 * 11/2001 Rutherford et al. .......... 65/60.8

FOREIGN PATENT DOCUMENTS

| EP | 1 050 601 A1 | 11/2000 |
| JP | 5-70119 | 3/1993 |
| JP | 11-233500 | 8/1999 |

OTHER PUBLICATIONS

U.S. Ser. No. 09/797,865 (Mar. 5, 2001 filed).

Taiwan Office Action with English Translation dated Jan. 5, 2004.

* cited by examiner

Primary Examiner—Terrel Morris
Assistant Examiner—Hai Vo
(74) Attorney, Agent, or Firm—Armstrong, Kratz, Quintos, Hanson & Brooks, LLP

(57) ABSTRACT

A composition comprising a siloxane resin, a silicon compound substantially consisting of silicon, carbon and hydrogen, wherein the number ratio of carbon to silicon atoms forming an —X— bond (wherein X is $(C)_m$ (where m is an integer in the range of from 1 to 3), or a substituted or unsubstituted aromatic group with 9 or less carbon atoms) in the main chain of one molecule is in the range of from 2:1 to 12:1, and a solvent, is subjected to a heat treatment to form a low dielectric constant film. Accordingly, a low dielectric constant film having excellent resistance against chemicals and excellent moisture resistance is provided. A semiconductor integrated circuit having a fast response can be produced by using the film.

13 Claims, 3 Drawing Sheets

SILICON-BASED COMPOSITION, LOW DIELECTRIC CONSTANT FILM, SEMICONDUCTOR DEVICE, AND METHOD FOR PRODUCING LOW DIELECTRIC CONSTANT FILM

CROSS-REFERENCE TO RELATED APPLICATIONS

This application is based upon and claims priority from Japanese Patent Application No. 2001-84475, filed in Mar. 23, 2001, the content being incorporated herein by reference.

BACKGROUND OF THE INVENTION

1. Field of the Invention

The present invention relates to a semiconductor device using a low dielectric constant film and a silicon-based composition used for the same, a low dielectric constant film, and a method for producing the low dielectric constant film.

2. Description of the Related Arts

It is important for integration and miniaturization of a semiconductor to reduce the parasitic capacitance that is generated between wirings in multilayer wiring processes of a semiconductor integrated circuit and to reduce the delay of the signal propagation speed (i.e., the wiring delay).

Although the reduction of the signal propagation speed by the parasitic capacitance of an insulating film has been recognized so far, the influence of the wiring delay on the entire device has not been so remarkable in the semiconductor devices of generations in which the wiring gap is larger than 1 $\mu$m.

In the case the wiring gap is 1 $\mu$m or less, however, the influence on the device speed becomes large. In particular, when a circuit is formed with the wiring gap being 0.5 $\mu$m or less as will be expected in near future, the parasitic capacitance between wirings will be affecting the device speed more. Accordingly this will be a big obstacle for the integration and miniaturization of a semiconductor.

In other words, while the reduction of the signal propagation speed depends largely on the wiring resistance and parasitic capacitance between wirings in the multilayer wiring of a semiconductor integrated circuit, higher integration of a device makes the width of a wiring and wiring gap narrower, resulting in increase in the wiring resistance and parasitic capacitance between wirings.

The capacitance of an insulating film can be reduced by making the wiring thickness thinner to reduce the cross-sectional area. However, making the wiring thinner results in larger wiring resistance, and therefore, a higher signal propagation speed cannot be achieved.

Accordingly, it is indispensable for achieving a higher signal propagation speed to make the resistance of a wiring and the dielectric constant of an insulating film lower, and it is expected that they will play very important roles in deciding properties of a device in future.

Wiring delay (T) is affected by wiring resistance (R) and capacitance (C) between wirings as shown in Eq. 1.

$$T \propto CR \quad (1)$$

In eq. 1, the relation between e (dielectric constant) and C is expressed by Eq. 1'.

$$C = \epsilon_0 \epsilon_r \cdot S/d \quad (1')$$

wherein S is an electrode area; $\epsilon_0$ is a dielectric constant of the vacuum; $\epsilon_r$ is a relative dielectric constant of an insulating film; and d is a wiring gap.

Therefore, the wiring delay is effectively diminished by making the dielectric constant of the insulating film lower.

Inorganic films such as silicon dioxide ($SiO_2$), silicon nitride (SiN), and phosphate silicate glass (PSG) and organic polymers such as polyimide have been used as insulating materials so far.

However, the dielectric constant of CVD-$SiO_2$ films, which are most frequently used for semiconductor devices, is about 4 or so. Although the dielectric constant of an SiOF film, which is now being calling attentions as a low dielectric constant CVD film, is about 3.3–3.5, it is hygroscopic, so that it has a problem in that the dielectric constant is increased by absorbing water.

In addition, as a low dielectric constant film, a porous film made of a siloxane resin having SiH bonds is known. However, when a semiconductor device is subjected to washing with an alkaline solution, there is a problem in that highly hygroscopic SiOH groups are formed as a result of hydrolysis, resulting in an increased dielectric constant, together with the problem of mechanical damages on the semiconductor part such as cracks caused by the washing. To solve these problems, a protecting film such as a $SiO_2$ film has been formed conventionally. However, this will make relatively smaller the rate of the low dielectric constant film in a semiconductor device, and accordingly, the effective dielectric constant will be increased when multi-layer wirings are formed.

To compare, organic polymer films can be used to have a lower dielectric constant. However, the glass transition temperatures are as low as 200–350° C. and the coefficients of thermal expansion are large, so that the damages to the wiring are problematic.

SUMMARY OF THE INVENTION

It is, therefore, the object of the present invention to solve the above-mentioned several problems in order to form an excellent film, as well as to provide an insulating film having a lower dielectric constant than those of conventional insulating films, and to provide fast and reliable semiconductor devices.

In addition, the present invention improves, in many cases, chemical resistance, especially against alkali solutions of a silica-based film, and it can solve the problem of highly hygroscopic characteristic presented in conventional porous films made of a siloxane resin.

According to one aspect of the present invention there is provided a composition comprising a siloxane resin, a silicon compound substantially consisting of silicon, carbon and hydrogen, wherein the number ratio of carbon to silicon atoms forming an —X— bond (wherein X is $(C)_m$ (where m is an integer in the range of from 1 to 3), or a substituted or unsubstituted aromatic group with carbon atoms of not more than 9) in the main chain of one molecule is from 2:1 to 12:1, as well as a solvent. Hereupon, it is to be noted that 'C' of $(C)_m$ means a carbon atom.

As other aspects of the present invention, there are provided a low dielectric constant film obtained by subjecting the composition to a heat treatment, a semiconductor device having the low dielectric constant film as an interlayer insulating film, and a method for producing the low dielectric constant film.

It was found that a film obtained by adding a silicon compound having a silicon-carbon bond(s) in the skeletal chain (main chain) to a siloxane resin is given a nature of repelling chemicals such as an alkali.

It was also found that, when the compound was added to a siloxane resin, the compound was homogeneously dispersed into the siloxane resin because of its high compatibility, and that the resistance against acidic and alkaline solutions was improved and was lasting even if the compound was added to the siloxane resin at a weight ratio of 0.1 part by weight based on 100 parts by weight of the siloxane resin.

It was also found that a silicon compound having a silicon-carbon bond(s) in its skeleton had a high moisture resistance, and therefore, the composition according to the present invention was effective even in forming porous films that would have a problem of low moisture resistance, unless it were used.

It was also found that the combination of a siloxane resin and such a silicon compound can prevent damages (mechanical damages such as cracks) caused on a siloxane-based low dielectric constant film in an alkaline solution, which has been a problem for low dielectric constant films having a SiH bond(s), and that the increase in the dielectric constant caused by the hygroscopic behavior can be solved in many cases, which has been another problem for low dielectric constant porous films.

Such a silicon compound can be identified as a silicon compound having an —X— bond (wherein X is $(C)_m$ (where m=1 to 3) or a substituted or unsubstituted aromatic group with 9 or less carbon atoms) in its main chain.

By using s silicon compound having the above-mentioned —X— bond (wherein X is $(C)_m$ (where m=1 to 3) or a substituted or unsubstituted aromatic group with 9 or less carbons) in its main chain, together with a siloxane resin, forming a coating film containing both, and heating the resultant film, it is possible to produce a low dielectric constant film with minimized hydrolysis and/or damages by the chemical treatment, while the elevation of the dielectric constant in a process for producing a semiconductor is suppressed.

It is preferable that the above-mentioned silicon compound has a structure represented by formula 2 below:

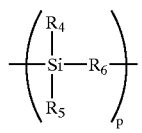

(2)

(wherein $R_4$ and $R_5$ are each, same or different, H or an aliphatic hydrocarbon group with 1 to 3 carbon atoms or a substituted or unsubstituted aromatic hydrocarbon group with 6 to 9 carbon atoms; $R_6$ is an aliphatic hydrocarbon group with 1 to 3 carbon atoms or a substituted or unsubstituted phenylene group; and p is an integer of 20 to 1,000).

Limitations on $R_4$, $R_5$ and degree of polymerization are necessary to keep the viscosity of the composition before forming a film in an appropriate range, while the limitation concerning $R_6$ is important to secure the heat resistance of the formed low dielectric constant film.

It is preferable that the above-mentioned siloxane resin has a structure represented by formula 3 below:

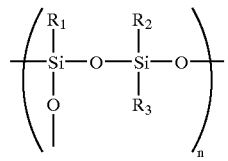

(3)

(wherein $R_1$, $R_2$, and $R_3$ are each, same or different, hydrogen, fluorine, a methyl group or an —O— bond; and n is an integer of 5 to 1,000).

It is not much preferable that $R_1$, $R_2$, or $R_3$ is an aliphatic hydrocarbon group other than hydrogen, fluoride, or a methyl group since the elimination of hydrogen is enhanced, resulting in acceleration of the formation of cross linkage. It has been found that, although the —O— bond also promotes crosslinking reactions, they do not cause practical problems.

The —X— bond used herein (wherein X is $(C)_m$ (where m is 1 to 3) or a substituted or unsubstituted aromatic group with 9 or less carbon atoms), taking the case of m=3 for example, means a state in which three carbon atoms are serially linked as C—C—C, wherein each carbon can have a substituent group(s) other than hydrogen. A simple example of the case of m=3 is propylene group. The m is limited to the range of from 1 to 3 because the decrease in heat resistance may be observed when m is 4 or larger. Phenylene group is an example of the substituted or unsubstituted aromatic group with 9 or less carbon atoms.

Tests revealed that a silicon compound substantially consisting of silicon, carbon and hydrogen, wherein the number ratio of carbon to silicon atoms forming an —X— bond (wherein X is $(C)_m$ (where m is an integer in the range of from 1 to 3), or a substituted or unsubstituted aromatic group with 9 or less carbon atoms) in the main chain of one molecule is from 2:1 to 12:1, is preferable, since it gives a low dielectric constant film having a good balance of low dielectric constant, chemical resistance against acids and alkalis, and moisture resistance.

From the viewpoint of the production method, the above-mentioned siloxane resin is preferably a siloxane resin obtained by subjecting to a heat treatment a mixture containing a tetraalkoxysilane (a) and an alkyltrialkoxysilane and/or trialkoxysilane (b) at a molar ratio (a:b) of 0:1 to 1:0.

In order to obtain a siloxane resin having consistent qualities, it is preferable to produce the resin by releasing, during the above-mentioned heat treatment, from 100 to 400 moles of alcohols out of 100 moles of (a+b), the total of the tetraalkoxysilane (a) and the alkyltrialkoxysilane and/or trialkoxysilane (b).

It has been also found that it is preferable that the carbon concentration in the siloxane resin is in the range of from 1 to 80 atom % per total atoms in the siloxane resin to achieve a consistent low dielectric constant. It is conjectured that hydrolysis is suppressed upon formation of the low dielectric constant film.

It has been also found that it is similarly preferable that the concentration of hydrogen atoms directly bonded to silicon in the siloxane resin is in the range of from 1 to 25 atom % per total atoms in the siloxane resin.

A case in which both conditions are satisfied is also one of the preferable embodiments.

It is preferable that the weight ratio of the above-mentioned silicon compound to the above-mentioned siloxane resin is in the range of from 0.001 to 2, that is, 0.1 to 200 parts by weight of the former based on 100 part by weight of the latter.

It is preferable that the composition according to the present invention also contains a substance selected from the group consisting of a novolak resin, an epoxy resin, an acrylic resin, a polyester, polypropylene, a phenol compound, an imidazole compound, and an adamantane compound.

It has been found that an acrylic resin is especially preferable among the above-mentioned substances.

There are various kinds of acrylic resins with respect to the degree of polymerization, the level of copolymerization, and so on. An appropriate one can be selected among them by a trial and error method.

These substances are added to form pores by the vaporization and dissipation thereof while a low dielectric constant film is being formed. That is, they are dissipating agents (pore-forming substances).

Although a low dielectric constant film having a further lower dielectric constant can be produced by the formation of pores, mechanical properties such as strength are deteriorated at the same time. Therefore, it is desirable that pores having appropriate sizes are distributed in an appropriate manner.

It is preferable to add from 5 to 200 parts by weight of a dissipating agent to 100 parts by weight of a siloxane resin. This is because the dielectric constant is not reduced enough when it is less than 5 parts by weight, and the strength of the film is reduced when it is more than 200 parts by weight.

It has been also found that a substance having a thermal weight loss coefficient in a specific range is appropriate as the above-mentioned substance. Namely, a substance is desirable which loses its weight by 5% by weight or more at 150° C. and loses its weight by 90% by weight or more at 400° C. when it is heated up from usual temperature at a rate of 10° C./min. This is probably because formation of the above-mentioned pores is appropriately controlled.

It is desirable that the porosity of the above-mentioned pores is from 10% to 70% by volume per the total volume of the low dielectric constant film. When the porosity is less than 10% by volume, its porosity-generating effect is small. When the porosity exceeds 70% by volume, mechanical properties are deteriorated. A desirable average pore size (diameter) is in the range of from 50 to 200 nm.

The above-mentioned examinations have revealed that a low dielectric constant film having an $SiO_4$ bond(s), a C—$SiO_3$— bond(s), as well as an —X— bond(s) (wherein X is $(C)_m$ (where m is an integer in the range of from 1 to 3), or a substituted or unsubstituted aromatic group with 9 or less carbon atoms), and having a porosity of from 10% to 70% by volume and a relative dielectric constant of from 1.4 to 2.5 achieves a low dielectric constant, suppresses the hydrolysis, and has good mechanical properties. A low dielectric constant film having such properties can be achieved by combining a film with a composition comprising a siloxane resin and a silicon compound having a silicon-carbon bond(s) in its skeletal chain, with pores.

As a representative mechanical strength, it is desirable that the tensile strength at break is from 30 to 80 MPa as measured by the Stud Pull method. A tensile strength at break of smaller than 30 MPa is not mechanically sufficient. When it exceeds 80 MPa, it is not inconvenient from a mechanical viewpoint, but the dielectric constant will be deteriorated in many cases.

The present invention has been achieved as a result of investigations of a system having an $SiO_4$ bond(s), C—$SiO_3$— bond(s), as well as an —X— bond(s) (wherein X is $(C)_m$ (where m is an integer in the range of from 1 to 3), or a substituted or unsubstituted aromatic group with 9 or less carbon atoms). However, when the achieved results are observed only from the viewpoint of physical properties, it can be considered that a low dielectric constant film having a porosity of from 10% to 70% by volume, a relative dielectric constant of from 1.4 to 2.5, and a tensile strength at break of from 30 to 80 MPa as measure by the Stud Pull method, and consisting substantially of silicon, carbon, hydrogen and oxygen, provides the above-mentioned various effects.

DESCRIPTION OF THE PREFERRED EMBODIMENTS

Figure 1:
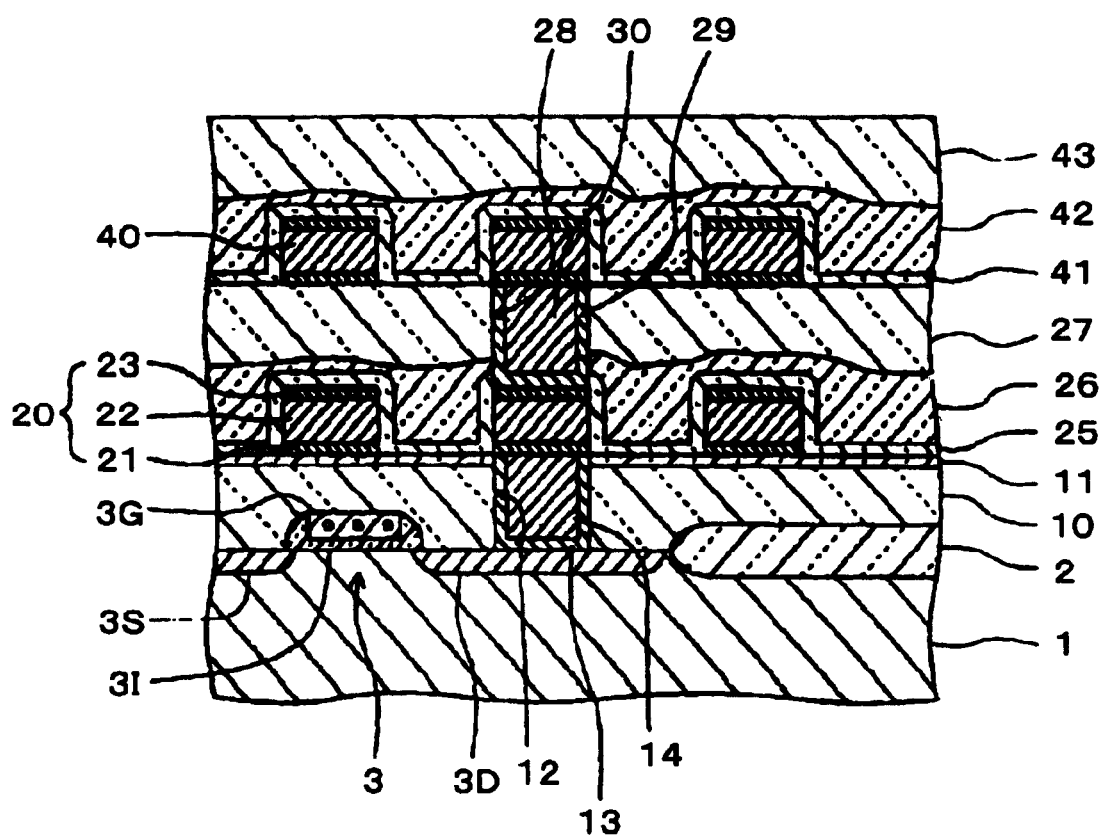
FIG. 1 is a cross-sectional view of a semiconductor device having an aluminum (Al) wiring.

Embodiments of the present invention are exemplarily illustrated using figures, tables, and examples below. The present invention is not limited to these examples, figures, and tables. Other embodiments an belong to the category of the present invention as long as they are within the scope and spirit of the present invention.

One of the embodiments of the present invention is a composition comprising a siloxane resin, a silicon compound which substantially consists of silicon, carbon and hydrogen, and has an —X— bond (wherein X is $(C)_m$ (where m is an integer in the range of from 1 to 3), or a substituted or unsubstituted aromatic group with 9 or less carbon atoms) in the main chain in one molecule in which a carbon atom vs. silicon atom ratio is 2:1 to 12:1, as well as a solvent.

Normally a siloxane resin therefor is prepared by heating a mixture containing a tetraalkoxysilane, an alkyltrialkoxysilane, and/or a trialkoxysilane, as well as a solvent, followed by vaporizing a predetermined amount of alcohol.

Although the silicon compound is normally added after the above-mentioned heating, it can be added also before the heating, if possible.

Silicon compounds containing a silicon-carbon bond(s) in their skeletons to be added to a siloxane resin according to the present invention include polydimethylcarbosilane, polyhydromethylcarbosilane,
polydiethylcarbosilane, polyhydroethylcarbosilane,
polycarbosilastyrene, polyphenylmethylcarbosilane,
polydiphenylcarbosilane,
polydimethylsilphenylenesiloxane,
polymethylsilphenylenesiloxane,
polydiethylsilphenylenesiloxane,
polyethylsilphenylenesiloxane,
polydipropylsilphenylenesiloxane,
polypropylsilphenylenesiloxane,
polyphenylsilphenylenesiloxane,
polydiphenylsilphenylenesiloxane,
polyphenylmethylsilphenylenesiloxane,
polyphenylethylsilphenylenesiloxane,
polyphenylpropylsilphenylenesiloxane,
polyethylmethylsilphenylenesiloxane,
polymethylpropylsilphenylenesiloxane, and
polyethylpropylsilphenylenesiloxane.

It is preferable to add from 0.1 to 200 parts by weight of a silicon compound to 100 parts by weight of a siloxane resin. If a silicon compound in an amount of smaller than 0.1 part by weight is added, sufficient chemical resistance is not obtained. If a silicon compound in an amount of larger than 200 parts by weight is added, the strength of the obtained film is reduced.

There is no specific limitation to a siloxane resin used for the present invention, as long as it can be diluted with a solvent. Such a siloxane resin includes a sol-gel type polymer of a tetraalkoxysilane, a sol-gel type polymer of a trialkoxysilane, a sol-gel type polymer of a methyltrialkoxysilane, a sol-gel type polymer of a tetraalkoxysilane and a trialkoxysilane, a sol-gel type polymer of a tetraalkoxysilane and a methyltrialkoxysilane, sol-gel type polymer of a methyltrialkoxysilane and a trialkoxysilane, a sol-gel type polymer of a tetraalkoxysilane and a dimethylalkoxysilane, hydrogen silsesquioxane, methyl silsesquioxane, and a fluorine-containing hydrogen silsesquioxane.

A silicon compound having a chemical structure represented by formula 2 above is preferable when a silicon compound such as is described above is defined by a chemical structure. A siloxane resin having a chemical structure represented by formula 3 above is preferable when a siloxane resin such as is described above is defined by a chemical structure.

A film can be formed by coating a composition according to the present invention, for example, by a spin coating method. There is no specific limitation to the diluting solvent, as long as it dissolves the siloxane resin and the silicon compound having a silicon-carbon bond(s) in its skeleton used for the present invention. Such a solvent includes cyclohexanone, methyl isobutyl ketone, methyl ethyl ketone, methyl cellosolve, ethyl cellosolve, octane, decane, propylene glycol, propylene glycol monomethyl ether, propylene glycol monomethyl ether acetate, diethylene glycol, propylene glycol, propylene glycol monomethyl ether, propylene glycol monoethyl ether, and propylene glycol monopropyl ether.

According to the present invention, when a porous film or the like is formed from the above-mentioned composition, sufficient alkali resistance (caustic resistance) and moisture resistance are realized.

A film can be formed using a material for forming a low dielectric constant film according to the present invention, for example, by coating the above-mentioned composition on a substrate by a spin coating method, vaporizing the solvent at a temperature of from 120° C. to 250° C., followed by a heat treatment of the coated composition at a temperature of 300° C. or higher to crosslink the siloxane resin. Also according to the present invention, a porous film can be formed, for example, by coating the above-mentioned composition on a substrate by a spin coating method and carrying out a vaporization treatment of the solvent as well as a dissipation treatment of the dissipating agent at a temperature of from 120° C. to 250° C., or by carrying out the vaporization treatment plus a dissipation treatment with a UV light irradiation, followed by a heat treatment of the coated composition at a temperature of 300° C. or higher to crosslink the siloxane resin.

EXAMPLES

Examples of the present invention are described hereinbelow.

The following methods were used for analyses.

The molecular weight of a siloxane resin or of a silicon compound was determined by gel permeation chromatography using tetrahydrofuran as a solvent, and was expressed as a polystyrene-converted molecular weight.

The number ratio of carbon to silicon atoms forming an —X— bond (wherein X is $(C)_m$ (where m is an integer in the range of from 1 to 3), or a substituted or unsubstituted aromatic group with 9 or less carbon atoms) in the main chain of one molecule of a silicon compound was determined by XPS (X-ray photospectroscopy).

The carbon concentration per the total atoms in a siloxane resin was determined by XPS (X-ray photospectroscopy).

The concentration of hydrogen atoms directly bonded to silicon per the total atoms in a siloxane resin was calculated from the result of IR measurement of a raw material.

The thermal weight loss was determined by the loss in weight through heating of about 10 mg of a specimen in an apparatus for thermogravimetry at a rate of 10° C./min from usual temperature up to 500° C.

Porosity was determined by a nitrogen absorption method.

Presence or absence of cracks was determined by the observation under an optical microscope.

Example 1

To a mixture consisting of 20.8 g (0.1 mol) of tetraethoxysilane, 17.8 g (0.1 mol) of methyltriethoxysilane and 39.6 g of methyl isobutyl ketone in a reactor, was added dropwise 16.2 g (0.9 mol) of an aqueous solution of nitric acid containing nitric acid at 400 ppm with stirring. The addition took 10 min. After the addition was completed, the reaction was continued for maturation for another 2 h. The reaction was carried out under agitation.

Then, 5 g of magnesium sulfate was added to remove excess water, and ethanol formed by the maturation was removed by a rotary evaporator so that the volume of the reaction mixture became 50 mL. Ethanol in an amount of 0.7 mol was formed.

To the obtained reaction mixture, was added 20 mL of methyl isobutyl ketone. Then, methyl isobutyl ketone was removed in an oven at 200° C. It was found that the reaction mixture contained solid at 17.4% by weight. To the reaction mixture, was added 1.74 g of methylhydropolycarbosilane to prepare a coating liquid for forming a film.

The above reactions and treatment with the rotary evaporator were carried out at usual temperature and under normal pressure.

Analyses revealed that the molecular weight of the siloxane resin and that of methylhydropolycarbosilane in the coating liquid for forming a film were 3,500 and 1,800, respectively.

The number ratio of carbon to silicon atoms forming an —X— bond (wherein X is $(C)_m$ (where m is an integer in the range of from 1 to 3), or a substituted or unsubstituted aromatic group with 9 or less carbon atoms) in the main chain of one molecule of methylhydropolycarbosilane was 3:1.

The carbon concentration based on the total atoms of the above-mentioned siloxane resin was 13 atom %.

The concentration of hydrogen atoms directly bonded to silicon based on the total atoms of the above-mentioned siloxane resin was 1 atom %.

Example 2

Treatment was carried out in a manner similar to that of Example 1 except that 20.8 g (0.1 mol) of tetraethoxysilane, 16.4 g (0.1 mol) of triethoxysilane, and 37.2 g of methyl isobutyl ketone were used instead of 20.8 g (0.1 mol) of tetraethoxysilane, 17.8 g (0.1 mol) of methyltriethoxysilane, and 39.6 g of methyl isobutyl ketone, and methyl isobutyl ketone was removed in an oven at 200° C. to show that the solution contained solid at 16.8% by weight. Ethanol in an amount of 0.7 mol was formed.

To the reaction mixture, was added 1.68 g of methylhydropolycarbosilane in a manner similar to that of Example 1 to prepare a coating liquid for forming a film.

Analyses revealed that the molecular weight of the siloxane resin in the coating liquid for forming a film was 2,800.

The carbon concentration based on the total atoms in the above-mentioned siloxane resin was 2 atom %.

The concentration of hydrogen atoms directly bonded to silicon based on the total atoms in the above-mentioned siloxane resin was 11 atom %.

Example 3

Treatment was carried out in a similar manner to that of Example 1, except that 17.8 g (0.1 mol) of methyltriethoxysilane, 16.4 g (0.1 mol) of triethoxysilane, and 37.2 g of methyl isobutyl ketone were used instead of 20.8 g (0.1 mol) of tetraethoxysilane, 17.8 g (0.1 mol) of methyltriethoxysilane, and 39.6 g of methyl isobutyl ketone, and methyl isobutyl ketone was removed in an oven at 200° C. to show that the solution contained solid at 15.8% by weight. Ethanol in an amount of 0.7 mol was formed.

To the reaction mixture, was added 1.58 g of methylhydropolycarbosilane in a manner similar to that of Example 1 to prepare a coating liquid for forming a film.

Analyses revealed that the molecular weight of the siloxane resin in the coating liquid for forming a film was 4,500.

The carbon concentration based on the total atoms of the above-mentioned siloxane resin was 11 atom %.

The concentration of hydrogen atoms directly bonded to silicon in the total atoms of the above-mentioned siloxane resin was 12 atom %.

Example 4

To the coating liquid for forming a film that was prepared in Example 1, was added 1.74 g of an acrylic resin to prepare a coating liquid for forming a porous film.

The above-mentioned acrylic resin lost 10% by weight of its weight at 150° C. and 100% by weight of its weight at 400° C.

Example 5

To the coating liquid for forming a film that was prepared in Example 2, was added 1.68 g of a polyester-based resin to prepare a coating liquid for forming a porous film.

The above-mentioned polyester-based resin lost 10% by weight of its weight at 150° C. and 95% by weight of its weight at 400° C.

Example 6

To the coating liquid for forming a film that was prepared in Example 3, was added 1.58 g of adamantane monophenol to prepare a coating liquid for forming a porous film.

The above-mentioned adamantane monophenol lost 60% by weight of its weight at 150° C. and 100% by weight of its weight at 400° C.

Example 7

The coating liquids for forming films and the coating liquids for forming porous films prepared in Examples 1 to 6 were spin-coated on an Si wafer at 3,000 revolutions per minute (rpm) for 20 seconds, and solvents were evaporated at 200° C., and the obtained films were annealed under a nitrogen atmosphere containing oxygen in nitrogen at 100 ppm or less at 400° C. for 30 min to form low dielectric constant insulating films.

On the obtained films, were formed Au electrodes having a thickness of 1 mm, and relative dielectric constants of the films calculated from capacitances determined are summarized in Table 1.

Dissipating agents were removed during the above-mentioned annealing step, forming pores.

The Porosity of the pores was 48% when the coating liquid of Example 4 was used, 42% when the coating liquid of Example 5 was used, and 45% when the coating liquid of Example 6 was used.

Analyses of these films by FT-IR and XPS confirmed the existence of $SiO_4$ bonds, C—$SiO_3$— bonds, and —X— bonds (wherein X is $(C)_m$ (where m is an integer in the range of from 1 to 3), or a substituted or unsubstituted aromatic group with 9 or less carbon atoms).

A tensile strength at break was 64 MPa as measured by the Stud Pull method.

Example 8

Concerning each of Examples 1 to 6, amounts of polycarbosilane added were changed as shown in Tables 2 and 3, and films were prepared in a manner similar to that of Example 7, and the obtained films were soaked in 2.38% by weight tetramethylammonium hydride aqueous solution, and in 5% by weight ammonium hydroxide aqueous solution, respectively, for 1 minute. Then cracks were observed, and changes in film thickness and dielectric constant were determined. As shown in Table 2, all the evaluation items after the soaking treatment showed no changes from those before the soaking treatment, when 0.1 part by weight or more of polymethylhydrocarbosilane was added.

Example 9

Next, structures of semiconductor devices prepared using coating liquids according to Examples 1 to 6 above and methods for producing them will be described.

It is to be noted here, that low dielectric constant films were formed below under a condition similar to that of Example 7.

FIG. 1 illustrates a cross-sectional view of a semiconductor device having aluminum (Al) wirings. An active region is demarcated by field-oxidized film 2 formed on the surface of silicon substrate 1. A MOSFET 3 is formed in the active region. The MOSFET 3 comprises source region 3S, drain region 3D, gate electrode 3G and gate oxidized film 3I.

Interlayer insulating film 10 made of $SiO_2$ and stopper film 11 made of SiN are formed over the substrate so as to cover MOSFET 3. Contact hole 12 is formed in interlayer insulating film 10 at a position corresponding to drain region 3D. Barrier layer 13 made of TiN covers the side wall and the bottom surface of contact hole 12. In addition, plug 14 made of tungsten (W) fills contact hole 12.

Barrier layer 13 and plug 14 are formed by chemical-mechanical polishing (CMP) after a TiN film and a W film are deposited all over the surface of the substrate. The TiN film is deposited by sputtering. The W film is deposited by chemical vapor deposition (CVD) using tungsten hexafluoride and hydrogen.

On the surface of stopper film 11, are formed first layer's wirings 20. First layer's wirings 20 have a three-layer structure consisting of TiN film 21 having a thickness of 50 nm (bottom), Cu-containing Al film 22 having a thickness of 450 nm, and TiN film 23 having a thickness of 50 nm (top) in this order. The TiN film and the Al film are patterned by plasma etching using hydrogen chloride gas. Parts of first layer's wirings 20 are electrically connected to W plug 14.

The surfaces of first layer's wirings 20 and stopper film 11 are covered with liner film 25 that is made of $Sio_2$ and has a thickness of 50 nm. Liner film 25 is formed by CVD using tetraethylorthosilicate (TEOS) and oxygen.

On liner film 25, is formed low dielectric constant film 26. Low dielectric constant film 26 can be formed by spin-coating the coating liquids according to the above-mentioned Examples 4 to 6. Low dielectric constant film 26 is formed so that the thickness is 500 nm when measured from the flat surface of the silicon substrate.

To explain in more detail, wirings 20 are formed by including the steps of forming a metal pattern surrounded with a low dielectric constant layer, and then, subjecting the surface of the metal pattern to chemical-mechanical polishing (CMP) together with the surface of the low dielectric constant layer in order to form a layer (or film 21, 22, or 23) of the wirings 20. In the course of forming the wirings, the low dielectric constant film 26 is formed by laminating dielectric constant layers such as described above.

On low dielectric constant film 26, is formed cap layer 27 that is made of $SiO_2$ and has a thickness of 1,000 nm. Cap layer 27 is formed by CVD using TEOS and oxygen. The upper surface of cap layer 27 is made flat by CMP. This polishing is carried out so that the total film thickness of liner film 25, low dielectric constant film 26 and cap layer 27 is 1,200 nm when measured at a location where first layer's wirings 20 are not placed.

In the three layers of liner film 25, low dielectric constant film 26 and cap layer 27, is formed via hole 28. Via hole 28 is formed by plasma etching using $CF_4$ and $CHF_3$. The side wall and bottom surface of via hole 28 are coated with barrier layer 29 made of TiN. W plug 30 fills in via hole 28. Barrier layer 29 and W plug 30 are formed in a manner similar to that for forming underlying barrier layer 13 and plug 14.

On cap layer 27, are formed second layer's wirings 40. Second layer's liner film 41, low dielectric constant film 42 and cap layer 43 are laminated so as to cover second layer's wirings 40. These are formed in a manner similar to that for forming the corresponding parts of the first layer.

In the multilayer wiring structure shown in FIG. 1, the gaps between wirings that are mutually adjacent in the same wiring layer are filled with a low dielectric constant film according to the present invention, so that the parasitic capacitance between wirings can be diminished. In addition, the moisture resistance of the film is not degraded and a low dielectric constant is maintained, even after the treatment using an alkali solution.

Figure 2:
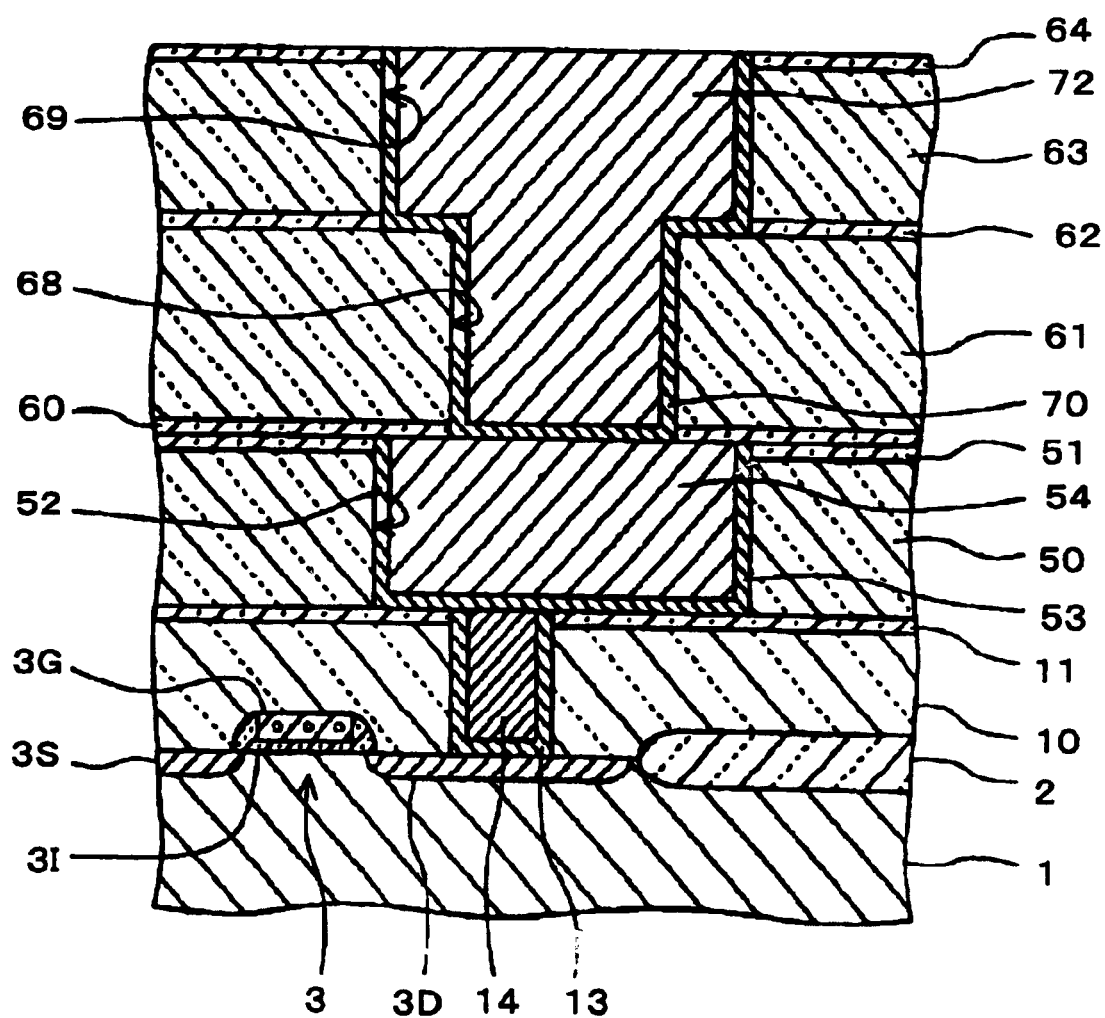
FIG. 2 is a cross-sectional view of a semiconductor device having a copper (Cu) wiring.

FIG. 2 illustrates a cross-sectional view of a semiconductor device having copper (Cu) wirings. The structures of the parts enumerated from silicon substrate 1 to stopper layer 11 are the same as those of corresponding parts of the semiconductor device shown in FIG. 1. Thus, these parts in FIG. 2 have the same reference numerals and signs as the corresponding parts in FIG. 1.

On stopper film 11, is formed low dielectric constant film 50. Low dielectric constant film 50 is formed using film-forming materials according to the above-mentioned examples so that the thickness is 450 nm as measured from the flat surface of the silicon substrate. Over low dielectric constant film 50, is formed cap layer 51 that is made of $SiO_2$ and has a thickness of 50 nm. Cap layer 51 is formed by CVD using TEOS and oxygen.

First layer's wiring groove 52 is formed across low dielectric constant film 50 and cap layer 51. First layer's wiring groove 52 is formed by plasma etching using $CF_4$ and $CHF_3$. On the bottom surface of first layer's wiring groove 52, appears the upper surface of plug 14.

The side wall and bottom surface of first layer's wiring groove 52 are covered with barrier layer 53 that is made of TaN and has a thickness of 50 nm. First layer's wiring 54 made of Cu fills in wiring groove 52.

Below are descriptions of methods for forming barrier layer 53 and first layer's wiring 54.

All over the substrate including the inner surface of first layer's wiring groove 52, is formed a TaN film by sputtering. On the formed film, is further formed a Cu film having a thickness of 50 nm by sputtering. A Cu film having a thickness of 600 nm is formed by electrolytic plating, using the formed Cu film as an electrode. Excessive parts of Cu and TaN films are removed by CMP, and barrier layer 53 and first layer's wiring 54 are left in first layer's wiring groove 52.

On cap layer 51, are laminated diffusion-preventing film 60 that is made of SiN and has a thickness of 50 nm, low dielectric constant film 61, stopper film 62 that is made of SiN and has a thickness of 50 nm, low dielectric constant film 63, and cap layer 64 that is made of SiN and has a thickness of 50 nm. Diffusion-preventing film 60 and stopper film 62 are formed by plasma CVD using silane and an ammonia gas. Low dielectric constant films 61 and 63 are formed using the silicon-based composition according to the present invention. Low dielectric constant films 61 and 63 are formed so that the thicknesses are 650 nm and 400 nm, respectively, when measured from the flat surface of the silicon substrate.

Surrounded by diffusion-preventing film 60 and low dielectric constant film 61, is formed via hole 68. Surrounded by stopper film 62, low dielectric constant film 63 and cap layer 64, is formed second layer's wiring groove 69. Inner surfaces of via hole 68 and second layer's wiring groove 69 are covered with barrier layer 70 that is made of TaN and has a thickness of 50 nm. Second layer's wiring 72 made of Cu fills in via hole 68 and second layer's wiring groove 69. Second layer's wiring 72 is formed by a dual damascene method.

Below is briefly described the dual damascene method. Firstly, via hole 68 is formed that ranges from cap layer 64 to the upper surface of first layer's wiring 54. Then, second layer's wiring groove 69 is formed that ranges from cap layer 64 to the upper surface of low dielectric constant film 61. Barrier layer 70 and second layer's wiring 72 are formed in a manner similar to the formation of underlying barrier layer 53 and first layer's wiring 54.

First layer's wiring 54 and second layer's wiring 72 are surrounded by low dielectric constant films 50, 61 and 63, so that the reduction of the parasitic capacitance between wirings can be achieved. In addition, these low dielectric constant films 50, 61 and 63 are formed with silicon-based compositions according to the present invention, so that the dielectric constant can be kept low without degrading the moisture resistance even after the treatment by an alkali treatment liquid.

Figure 3:
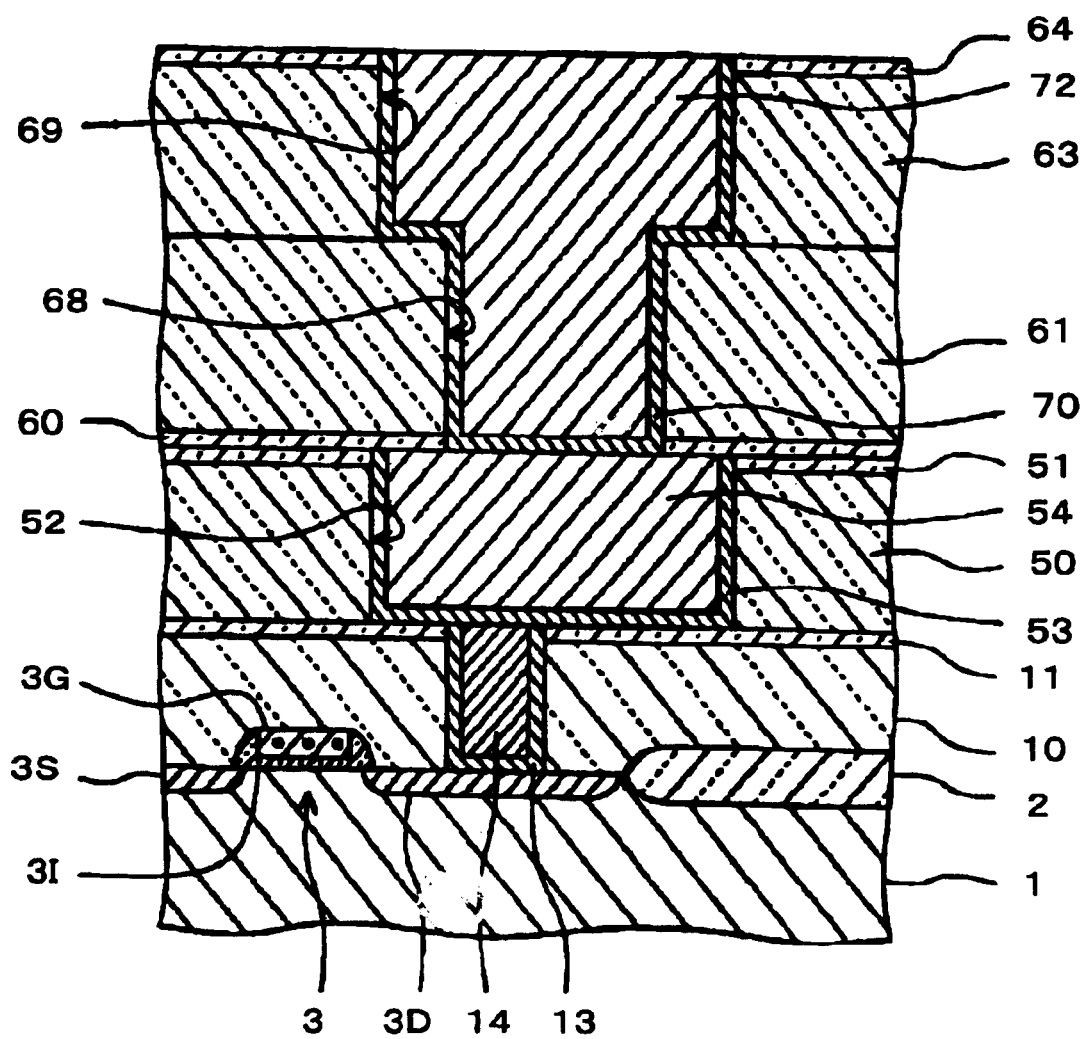
FIG. 3 illustrates a semiconductor device obtained by somewhat modifying the semiconductor device in FIG. 2.

FIG. 3 illustrate a semiconductor device prepared by somewhat modifying the semiconductor device shown by FIG. 2.

Stopper film 62 made of silicon nitride is placed between low dielectric constant film 61 and low dielectric constant film 63 thereon in the semiconductor device shown in FIG. 2, while stopper film 62 is not placed in FIG. 3, and low dielectric constant film 63 is in contact with low dielectric constant film 61 in the semiconductor device.

Such a structure can be obtained by selecting materials for the low dielectric constant films, so that the etching rate of the overlying low dielectric constant film 63 is faster than that of the underlying dielectric constant film 61 under the same etching condition.

If the etching rate of the overlying low dielectric constant film 63 is faster than that of the underlying dielectric constant film 61, the underlying low dielectric constant film 61 exposed after removing the overlying low dielectric constant film 63 by etching, is etched more slowly, when the second layer's wiring groove is formed by etching after via hole 68 is formed, with a result that the overlying low dielectric constant film 63 can be removed without removing the underlying low dielectric constant film 61.

TABLE 1

Relative dielectric constants of coatings

| | |
|---|---|
| Example 1 | 2.92 |
| Example 2 | 2.88 |
| Example 3 | 2.79 |
| Example 4 | 2.12 |
| Example 5 | 2.16 |
| Example 6 | 2.14 |

A low dielectric constant film formed according to the present invention has a low dielectric constant. The film also has mostly excellent resistance against chemicals such as acids and alkalis, and excellent moisture resistance, so that a dielectric constant of the film is increased little by absorbing moisture. The film formed according to the present invention is effective as a low dielectric constant interlayer insulating film for a semiconductor device. Using this insulating film permits obtaining excellent semiconductor integrated circuits having a fast response and/or a good resistance (chemical resistance) against the generations of cracks or the like.

What is claimed is:

1. A low dielectric constant film obtained by subjecting to a heat treatment a mixed composition comprising:

a siloxane resin having a structure represented by formula (3):

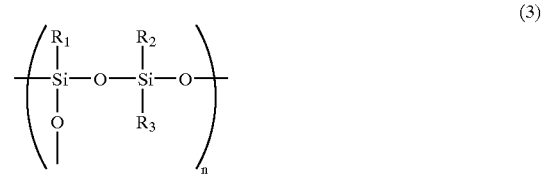

wherein $R_1$, $R_2$, and $R_3$ are each the same or different, hydrogen, fluorine, a methyl group or an —O— group; and n is an integer in the range from 5 to 1,000;

a silicon compound having a structure represented by formula (2):

TABLE 2

Results of dipping in 2.38% tetramethylammonium hydride aqueous solution

| Added polycarbosilane | Presence or absence of cracks Example | | | | | | Change in film thickness Example | | | | | | Change in relative dielectric constant Example | | | | | |
|---|---|---|---|---|---|---|---|---|---|---|---|---|---|---|---|---|---|---|
| (pts. wt.) | 1 | 2 | 3 | 4 | 5 | 6 | 1 | 2 | 3 | 4 | 5 | 6 | 1 | 2 | 3 | 4 | 5 | 6 |
| 0 | − | + | + | − | + | + | −54 nm | −34 nm | −38 nm | −45 nm | −39 nm | −52 nm | +0.8 | +0.4 | +1.2 | +0.6 | +0.8 | +0.5 |
| 0.05 | − | + | + | − | + | + | −12 nm | −18 nm | −23 nm | −21 nm | −22 nm | −19 nm | +0.2 | +0.3 | +0.4 | +0.4 | +0.5 | +0.4 |
| 0.1 | − | − | − | − | − | − | <−1 nm | <−1 nm | <−1 nm | <−1 nm | <−1 nm | <−1 nm | <±0.1 | <±0.1 | <±0.1 | <±0.1 | <±0.1 | <±0.1 |
| 10 | − | − | − | − | − | − | <−1 nm | <−1 nm | <−1 nm | <−1 nm | <−1 nm | <−1 nm | <±0.1 | <±0.1 | <±0.1 | <±0.1 | <±0.1 | <±0.1 |
| 50 | − | − | − | − | − | − | <−1 nm | <−1 nm | <−1 nm | <−1 nm | <−1 nm | <−1 nm | <±0.1 | <±0.1 | <±0.1 | <±0.1 | <±0.1 | <±0.1 |
| 100 | − | − | − | − | − | − | <−1 nm | <−1 nm | <−1 nm | <−1 nm | <−1 nm | <−1 nm | <±0.1 | <±0.1 | <±0.1 | <±0.1 | <±0.1 | <±0.1 |
| 180 | − | − | − | − | − | − | <−1 nm | <−1 nm | <−1 nm | <−1 nm | <−1 nm | <−1 nm | <±0.1 | <±0.1 | <±0.1 | <±0.1 | <±0.1 | <±0.1 |
| 200 | − | − | − | − | − | − | <−1 nm | <−1 nm | <−1 nm | <−1 nm | <−1 nm | <−1 nm | <±0.1 | <±0.1 | <±0.1 | <±0.1 | <±0.1 | <±0.1 |
| 250 | − | − | − | − | − | − | <−1 nm | <−1 nm | <−1 nm | <−1 nm | <−1 nm | <−1 nm | <±0.1 | <±0.1 | <±0.1 | <±0.1 | <±0.1 | <±0.1 |

TABLE 3

Results of dipping in 3.5% ammonia aqueous solution

| Added polycarbosilane | Presence or absence of cracks Example | | | | | | Change in film thickness Example | | | | | | Change in relative dielectric constant Example | | | | | |
|---|---|---|---|---|---|---|---|---|---|---|---|---|---|---|---|---|---|---|
| (pts. wt.) | 1 | 2 | 3 | 4 | 5 | 6 | 1 | 2 | 3 | 4 | 5 | 6 | 1 | 2 | 3 | 4 | 5 | 6 |
| 0 | − | − | + | − | − | + | −32 nm | −31 nm | −35 nm | −36 nm | −15 nm | −34 nm | +0.8 | +0.3 | +0.2 | +0.4 | +0.2 | +0.4 |
| 0.05 | − | − | + | − | − | + | −5 nm | −9 nm | −5 nm | −8 nm | −5 nm | −12 nm | +0.2 | +0.2 | +0.2 | +0.3 | +0.2 | +0.2 |
| 0.1 | − | − | − | − | − | − | <−1 nm | <−1 nm | <−1 nm | <−1 nm | <−1 nm | <−1 nm | <±0.1 | <±0.1 | <±0.1 | <±0.1 | <±0.1 | <±0.1 |
| 10 | − | − | − | − | − | − | <−1 nm | <−1 nm | <−1 nm | <−1 nm | <−1 nm | <−1 nm | <±0.1 | <±0.1 | <±0.1 | <±0.1 | <±0.1 | <±0.1 |
| 50 | − | − | − | − | − | − | <−1 nm | <−1 nm | <−1 nm | <−1 nm | <−1 nm | <−1 nm | <±0.1 | <±0.1 | <±0.1 | <±0.1 | <±0.1 | <±0.1 |
| 100 | − | − | − | − | − | − | <−1 nm | <−1 nm | <−1 nm | <−1 nm | <−1 nm | <−1 nm | <±0.1 | <±0.1 | <±0.1 | <±0.1 | <±0.1 | <±0.1 |
| 180 | − | − | − | − | − | − | <−1 nm | <−1 nm | <−1 nm | <−1 nm | <−1 nm | <−1 nm | <±0.1 | <±0.1 | <±0.1 | <±0.1 | <±0.1 | <±0.1 |
| 200 | − | − | − | − | − | − | <−1 nm | <−1 nm | <−1 nm | <−1 nm | <−1 nm | <−1 nm | <±0.1 | <±0.1 | <±0.1 | <±0.1 | <±0.1 | <±0.1 |
| 250 | − | − | − | − | − | − | <−1 nm | <−1 nm | <−1 nm | <−1 nm | <−1 nm | <−1 nm | <±0.1 | <±0.1 | <±0.1 | <±0.1 | <±0.1 | <±0.1 |

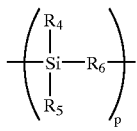 (2)

wherein $R_4$ and $R_5$ are each the same or different, H, an aliphatic hydrocarbon group with 1 to 3 carbon atoms, or a substituted or unsubstituted aromatic hydrocarbon group with 6 to 9 carbon atoms; $R_6$ is an aliphatic hydrocarbon group with 1 to 3 carbon atoms, or a substituted or unsubstituted phenylene group; and p is an integer in the range from 20 to 1,000; and a solvent.

2. A low dielectric constant film according to claim 1, having pores with a porosity in the range of from 10% to 70% by volume.

3. A low dielectric constant film according to claim 1, having a tensile strength at break in the range of from 30 to 80 MPa as measured by Stud Pull method.

4. A semiconductor device having, as an interlayer insulating film, a low dielectric constant film according to claim 1.

5. A low dielectric constant film according to claim 1, said film having porosity in the range from 10% to 70% by volume, and a relative dielectric constant in the range from 1.4 to 2.5.

6. A low dielectric constant film according to claim 1, wherein said siloxane resin is obtained:

by subjecting to a heat treatment a mixture containing a tetraalkoxysilane (a) and an alkyltrialkoxysilane and/or trialkoxysilane (b) at a molar ratio (a:b) of 0:1 to 1:0; and by releasing from 100 to 400 moles of alcohols out of 100 moles of (a+b), the total of the tetraalkoxysilane (a) and the alkytrialkoxysilane and/or trialkoxysilane (b).

7. A low dielectric constant film according to claim 1, wherein the carbon concentration in said siloxane resin is in the range from 1 to 80 atom % based on the total atoms of the siloxane resin.

8. A low dielectric constant film according to claim 1, wherein the concentration of hydrogen atoms directly bonded to silicon in said siloxane resin is in the range from 1 to 25 atom % based on the total atoms of the siloxane resin.

9. A low dielectric constant film according to claim 1, wherein from 0.1 to 200 parts by weight of said silicon resin is used based on 100 parts by weight of said siloxane resin.

10. A low dielectric constant film according to claim 1, wherein:

the mixed composition contains a dissipating agent for forming pores; and the dissipating agent comprises a substance that loses the weight by 5% by weight or more at 150° C. and by 90% by weight or more at 400° C. when heated up at a rate of 10° C./min from said usual temperature.

11. A low dielectric constant film according to claim 1, wherein said dissipating agent comprises at least one substance selected from the group consisting of a novolak resin, an epoxy resin, an acrylic resin, a polyester, a polypropylene, a phenol compound, an imidazole compound, and an adamantane compound.

12. A low dielectric constant film according to claim 1, wherein 5 to 200 parts by weight of said dissipating agent is added to 100 parts by weight of the siloxane resin.

13. A low dielectric constant film according to claim 1, wherein said dissipating agent is an acrylic resin.

* * * * *